US012334781B2

United States Patent
McDonald et al.

(10) Patent No.: US 12,334,781 B2
(45) Date of Patent: Jun. 17, 2025

(54) COOLING SYSTEM WITH THERMOELECTRIC DEVICE IN SEALED STATOR CHAMBER FOR VARIABLE TORQUE GENERATION ELECTRIC MACHINE

(71) Applicant: Falcon Power, LLC, Titusville, FL (US)

(72) Inventors: Harley C. McDonald, Merritt Island, FL (US); James L. Bailey, Titusville, FL (US); Matthew C. McDonald, Merritt Island, FL (US)

(73) Assignee: Falcon Power, LLC, Titusville, FL (US)

( * ) Notice: Subject to any disclaimer, the term of this patent is extended or adjusted under 35 U.S.C. 154(b) by 688 days.

(21) Appl. No.: 17/190,347

(22) Filed: Mar. 2, 2021

(65) Prior Publication Data

US 2021/0273502 A1 Sep. 2, 2021

Related U.S. Application Data

(60) Provisional application No. 63/077,243, filed on Sep. 11, 2020, provisional application No. 62/984,270, filed on Mar. 2, 2020.

(51) Int. Cl.
*H02K 1/20* (2006.01)
*H02K 1/16* (2006.01)
(Continued)

(52) U.S. Cl.
CPC .............. *H02K 11/28* (2016.01); *H02K 1/16* (2013.01); *H02K 1/20* (2013.01); *H02K 1/278* (2013.01);
(Continued)

(58) Field of Classification Search
CPC .. H02K 1/20; H02K 3/24; H02K 5/10; H02K 5/20; H02K 9/197
See application file for complete search history.

(56) References Cited

U.S. PATENT DOCUMENTS

| 2,243,616 A | 5/1941 | Julius et al. |
| 2,475,169 A | 7/1949 | Zahn |

(Continued)

FOREIGN PATENT DOCUMENTS

| CN | 109617319 A | 4/2019 |
| CN | 109995159 A | 7/2019 |

(Continued)

OTHER PUBLICATIONS

Kreisfeld (DE-4411055-A1) English Translation (Year: 1995).*
(Continued)

*Primary Examiner* — Tulsidas C Patel
*Assistant Examiner* — Robert E Mates
(74) *Attorney, Agent, or Firm* — Kevin E. West; Advent, LLP

(57) ABSTRACT

An electric machine having a housing with a stator chamber, an axle supported by at least one bearing assembly so that the axle may rotate with respect to the housing, a stator assembly with a stator core and a plurality of wire windings around the stator core, a rotor assembly with a magnet assembly for generating a magnetic field in the stator assembly wherein a coolant is circulated through the stator chamber over the stator core and plurality of wire windings to remove heat, and a plurality of thermoelectric devices. The thermoelectric devices are located around the inner circumference of the housing so that the coolant is circulated over the plurality of thermoelectric devices. The plurality of thermoelectric use the Peltier effect to cool the coolant (Continued)

flowing through the stator chamber or generate an electrical current that can be used by the electric machine.

20 Claims, 18 Drawing Sheets

(51) Int. Cl.
| | |
|---|---|
| H02K 1/278 | (2022.01) |
| H02K 3/24 | (2006.01) |
| H02K 5/10 | (2006.01) |
| H02K 5/20 | (2006.01) |
| H02K 9/197 | (2006.01) |
| H02K 11/28 | (2016.01) |
| H02K 29/03 | (2006.01) |
| H03K 3/011 | (2006.01) |
| H03K 17/687 | (2006.01) |
| H05K 7/20 | (2006.01) |

(52) U.S. Cl.
CPC ............ *H02K 3/24* (2013.01); *H02K 5/20* (2013.01); *H02K 9/197* (2013.01); *H02K 29/03* (2013.01); *H03K 3/011* (2013.01); *H03K 17/6871* (2013.01); *H05K 7/209* (2013.01); *H02K 5/10* (2013.01); *H02K 2213/03* (2013.01)

(56) References Cited

U.S. PATENT DOCUMENTS

| | | | |
|---|---|---|---|
| 2,828,955 A | 4/1958 | Murray | |
| 3,675,170 A | 7/1972 | Wellman, Jr. | |
| 3,836,802 A | 9/1974 | Parker | |
| 4,207,773 A | 6/1980 | Stahovic | |
| 5,164,872 A | 11/1992 | Howell | |
| 5,260,642 A | 11/1993 | Huss | |
| 5,855,256 A | 1/1999 | Kuwahara | |
| 6,738,246 B1 | 5/2004 | Strümpler | |
| 7,159,851 B1 | 1/2007 | Ross et al. | |
| 7,453,341 B1 | 11/2008 | Hildenbrand | |
| 7,605,570 B2 | 10/2009 | Liu et al. | |
| 7,821,753 B2 | 10/2010 | Evans et al. | |
| 8,145,312 B2 | 3/2012 | Wotherspoon | |
| 9,076,607 B2 | 7/2015 | Premerlani et al. | |
| 9,593,753 B2 | 3/2017 | Davey et al. | |
| 9,654,035 B1 | 5/2017 | Cieslewski et al. | |
| 9,921,330 B2 | 3/2018 | Berglund | |
| 10,320,272 B1 | 6/2019 | Juarez | |
| 10,418,899 B2 | 9/2019 | Lui et al. | |
| 10,581,287 B2 | 3/2020 | Swales et al. | |
| 11,094,807 B2 | 8/2021 | Cattani et al. | |
| 11,114,855 B2 | 9/2021 | Handelsman et al. | |
| 11,251,622 B1 | 2/2022 | Sherwood et al. | |
| 11,264,157 B2 | 3/2022 | Choi | |
| 11,368,100 B2 | 6/2022 | Danforth, III et al. | |
| 12,003,146 B2 | 6/2024 | McDonald | |
| 2004/0183510 A1 | 9/2004 | Sutardja et al. | |
| 2004/0251869 A1* | 12/2004 | Vadstrup | H02K 11/0094 318/807 |
| 2005/0140231 A1 | 6/2005 | Ogoshi | |
| 2010/0270804 A1 | 10/2010 | Datel | |
| 2013/0019917 A1 | 1/2013 | Pal | |
| 2013/0049509 A1 | 2/2013 | Shin | |
| 2013/0175894 A1 | 7/2013 | Chen | |
| 2013/0207488 A1 | 8/2013 | Labbe et al. | |
| 2013/0234779 A1 | 9/2013 | Klug, Jr. | |
| 2013/0342057 A1 | 12/2013 | Fried | |
| 2014/0035412 A1 | 2/2014 | Brewster et al. | |
| 2014/0070675 A1 | 3/2014 | Linnebjerg | |
| 2014/0117949 A1 | 5/2014 | Sadwick et al. | |
| 2014/0313557 A1 | 10/2014 | Brown et al. | |
| 2014/0354089 A1 | 12/2014 | Chamberlin et al. | |
| 2015/0048705 A1 | 2/2015 | Davey et al. | |
| 2015/0061437 A1* | 3/2015 | Hudec | H02K 5/128 310/86 |
| 2015/0318851 A1 | 11/2015 | Roberts et al. | |
| 2015/0349387 A1 | 12/2015 | Inaba et al. | |
| 2016/0005519 A1 | 1/2016 | Choi | |
| 2016/0019917 A1 | 1/2016 | Du et al. | |
| 2016/0036308 A1 | 2/2016 | Bailey et al. | |
| 2016/0164378 A1 | 6/2016 | Gauthier et al. | |
| 2016/0301339 A1 | 10/2016 | Ito | |
| 2017/0160540 A1 | 6/2017 | Giusti et al. | |
| 2017/0271954 A1 | 9/2017 | Hanumalagutti et al. | |
| 2017/0282687 A1 | 10/2017 | Kalore et al. | |
| 2018/0048255 A1 | 2/2018 | Marvin et al. | |
| 2018/0205303 A1 | 7/2018 | Del Curto | |
| 2018/0261412 A1 | 9/2018 | Schaper et al. | |
| 2019/0158000 A1 | 5/2019 | Oelofse | |
| 2019/0207447 A1 | 7/2019 | Swales et al. | |
| 2019/0283548 A1* | 9/2019 | Saito | B01D 53/04 |
| 2020/0007000 A1* | 1/2020 | Berendes | H02K 5/128 |

FOREIGN PATENT DOCUMENTS

| | | | | |
|---|---|---|---|---|
| CN | 110176826 A | 8/2019 | | |
| DE | 4411055 A1 * | 8/1995 | ............... | H02K 5/20 |
| DE | 102012020958 A1 | 4/2014 | | |
| DE | 102015220852 A1 * | 4/2017 | ............. | H02K 11/33 |
| EP | 0224660 A1 | 6/1987 | | |
| EP | 0224660 B1 | 11/1989 | | |
| EP | 1271747 A1 | 1/2003 | | |
| EP | 1480327 B1 | 11/2007 | | |
| EP | 3252934 A1 | 12/2017 | | |
| EP | 3664262 A1 | 6/2020 | | |
| JP | 2005045984 A | 2/2005 | | |
| JP | 2007336670 A | 12/2007 | | |
| JP | 2010213413 A | 9/2010 | | |
| JP | 2010263725 A | 11/2010 | | |
| JP | 2013509855 A | 3/2013 | | |
| JP | 2018126052 A | 8/2018 | | |
| JP | 2019126172 A | 7/2019 | | |
| KR | 20080070161 A | 7/2008 | | |
| KR | 20090049188 A | 5/2009 | | |
| KR | 20120056623 A | 6/2012 | | |
| KR | 20120067855 A * | 6/2012 | | |
| KR | 20170060055 A | 5/2017 | | |
| KR | 20180004139 A | 1/2018 | | |
| KR | 20180041039 A | 4/2018 | | |
| RU | 2543993 C2 | 3/2015 | | |
| TW | 200719808 A | 5/2007 | | |
| TW | 201230626 A | 7/2012 | | |
| TW | 201328140 A | 7/2013 | | |
| TW | 201330455 A | 7/2013 | | |
| TW | 201601420 A | 1/2016 | | |
| TW | 201824708 A | 7/2018 | | |
| WO | WO-2009137326 A1 * | 11/2009 | ........... | E21B 43/128 |
| WO | WO-2011099603 A1 * | 8/2011 | ............. | H02K 5/128 |
| WO | 2015126981 A1 | 8/2015 | | |
| WO | 2017018578 A1 | 2/2017 | | |

OTHER PUBLICATIONS

Kim (KR 20120067855 A) English Translation (Year: 2012).*
Liu (DE 102015220852 A1) English Translation (Year: 2017).*
Jim Davis, Hot-swap controllers: A programmable approach, Feb. 8, 2011, EE Times, www.eetimes.com/hot-swap-controllers-a-programmable-approach/ accessed Jul. 27, 2023 (Year: 2011).
Matsui, N., "Design and Control of Variable Field Permanent Magnet Motors," IEEJ Transactions on Electrical and Electronic Engineering, IEEJ Trans 14, 2019, pp. 966-981.
PCT International Search Report and Written Opinion forPCT/US2021/020558, dated Jun. 24, 2021.
PCT International Search Report and Written Opinion forPCT/US2021/020562, dated Jun. 28, 2021.
PCT International Search Report and Written Opinionfor PCT/US2021/010008, dated Jun. 29, 2021.
PCT InternationalSearch Report and Written Opinion for PCT/US2021/020559, dated Jun. 29, 2021.

(56) References Cited

OTHER PUBLICATIONS

PCTInternational Search Report and Written Opinion for PCT/US2021/010006, datedJun. 28, 2021.
Extended European Search Report from European Application No. 21764516.7, dated Apr. 5, 2024.
Extended European Search Report and Written Opinion from App. No. EP21763593, dated Apr. 29, 2024.
Office Action from Taiwanese Application No. 110107336, dated Oct. 1, 2024.
Office Action from Taiwanese Application No. 110107393, dated Oct. 1, 2024.
Notice of Preliminary Rejection for Korean Application No. 10-2022-7033524, dated Mar. 24, 2025.
Notice of Reasons for Rejection for Japanese Patent Application No. 2022-552520, dated Mar. 18, 2025.
Notice of Reason(s) for Rejection for Japanese Patent Application No. 2022-552523, dated Jan. 17, 2025.
Office Action from Taiwanese Application No. 110107388, dated Mar. 4, 2025.

\* cited by examiner

COOLING SYSTEM WITH THERMOELECTRIC DEVICE IN SEALED STATOR CHAMBER FOR VARIABLE TORQUE GENERATION ELECTRIC MACHINE

CROSS-REFERENCE TO RELATED APPLICATIONS

The present application claims priority under 35 U.S.C. § 119(e) of U.S. Provisional Application Ser. No. 62/984,270, filed Mar. 2, 2020, and titled "Variable Torque Generation Electric Machine Employing Tunable Halbach Magnet Array." The present application claims priority under 35 U.S.C § 119 (e) of U.S. Provisional Application Ser. No. 62/077,243, filed Sep. 11, 2020, and titled "Cascade Mosfet Design for Variable Torque Generator/Motor Gear Switching." The co-pending Non-Provisional application Ser. No. 17/190,354 titled "Cascade Mosfet Design for Variable Torque Generator/Motor Gear Switching" dated Mar. 2, 2021 is incorporated by reference herein in its entirety. Furthermore, the co-pending Non-Provisional application Ser. No. 17/190,362 titled "Variable Torque Generation Electric Machine Employing Tunable Halbach Magnet Array" dated Mar. 2, 2021 is incorporated by reference herein in its entirety.

BACKGROUND

Electric machines are devices that use electromagnetic forces to convert electrical energy to mechanical energy or mechanical energy to electrical energy. Common electric machines include electric generators and electric motors.

Electric generators convert mechanical energy into electrical energy for use in an external circuit such as a power grid, an electrical system in a vehicle, and so forth. Most generators employ a motive power source in the form a rotary force (torque) such as the rotation of a shaft. The rotary force causes electric current to be generated in one or more wire windings through interaction between magnetic fields created by magnets within the generator and the wire windings. Common sources of motive power include steam turbines, gas turbines, hydroelectric turbines, internal combustion engines, and the like, which have a constant torque and continuous rotational speed, expressed in Revolutions Per Minute (RPM).

Electric motors are mechanically identical to electric generators but operate in reverse. Electric motors convert electrical energy into mechanical energy through the interaction between magnetic fields created by magnets within the motor and electric current passing through one or more wire windings to generate a motive force in the form of rotation of the motor's shaft (i.e., a rotary force or torque). This rotary force (torque) is then used to propel some external mechanism. Electric motors are generally designed to provide continuous rotation and constant torque. In certain applications, such as in vehicles employing regenerative braking with traction motors, electric motors can be used in reverse as generators to recover energy that might otherwise be lost as heat and friction.

Increasingly, electric generators employed in renewable energy technologies must operate at rotational speeds (RPM) and torque that vary widely because the power sources used are variable, untimely, and often unpredictable. Similarly, electric motors employed by environmentally friendly or green technologies must be capable of producing a range of rotational speeds (RPM) and torques. However, while conventional electric generators and motors often demonstrate efficiencies ranging from ninety to ninety-eight percent (90%-98%) when operating near their rated rotational speed (RPM)) and torque, the efficiencies of these same generators and motors decreases dramatically, often as low as thirty to sixty percent (30%-60%) when they are operating outside of their rated rotational speed (RPM) and/or torque.

DRAWINGS

The Detailed Description is described with reference to the accompanying figures. The use of the same reference numbers in different instances in the description and the figures may indicate similar or identical items. Additionally, it will be appreciated by those of ordinary skill in the art that the concepts disclosed herein may be applied to various kinds of electric machines including, but not limited to, electric motors, electric generators, and/or electromechanical transmission systems. Thus, throughout this disclosure and in the claims that follow, the term electric machine is used generally to describe any electromechanical device capable of employing the concepts described herein, and it should be appreciated that, unless otherwise so stated, that the term electric machine may refer to an electric motor, an electric generator, an linear motor, an electromechanical transmission system, or combinations thereof (e.g., an electric machine suitable for use in a hybrid vehicle employing regenerative braking), and so forth.

DETAILED DESCRIPTION

Overview

Figure 1:
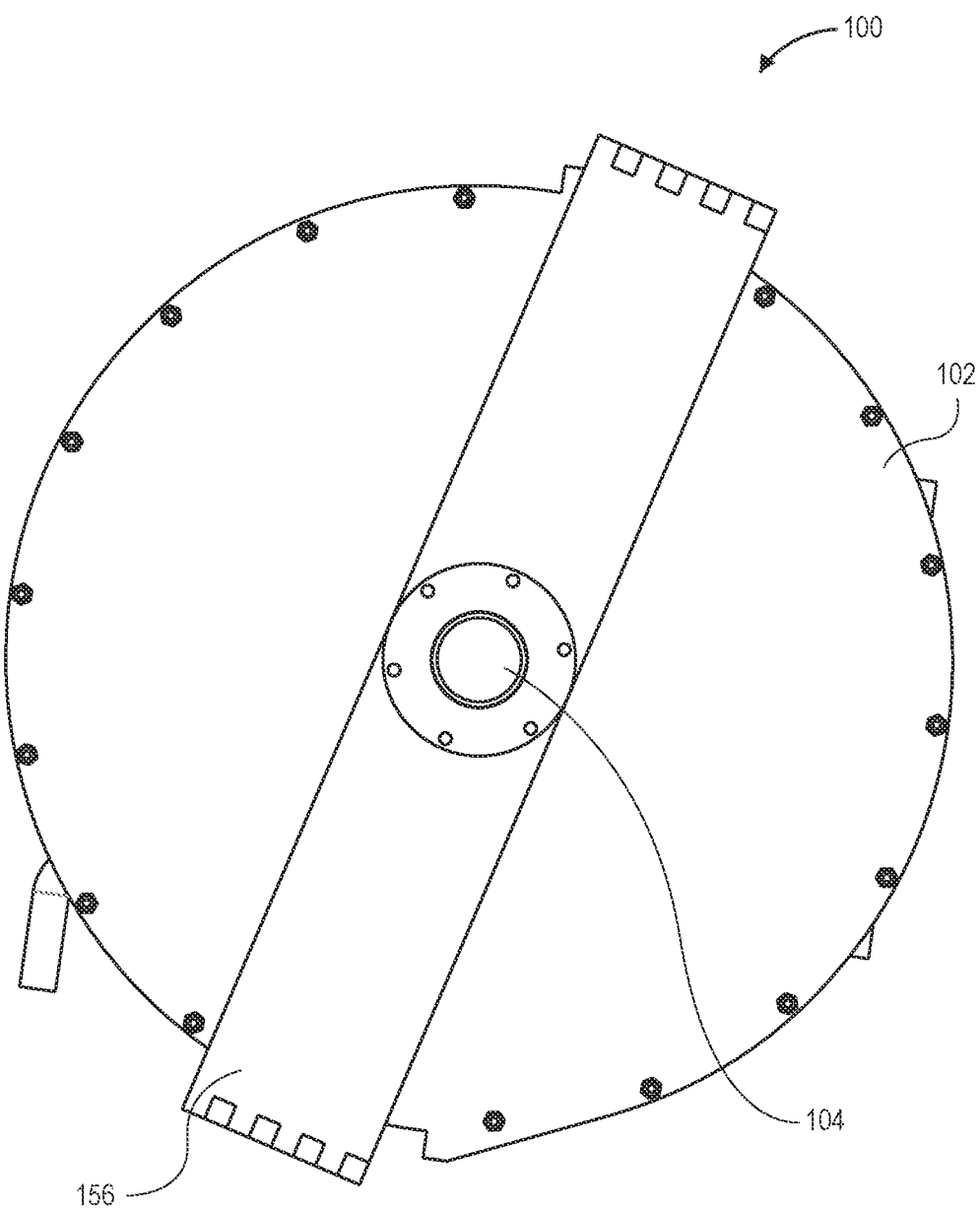
FIG. 1 is a side view illustrating an electric machine, in accordance with an example embodiment of the present disclosure.
Figure 2:
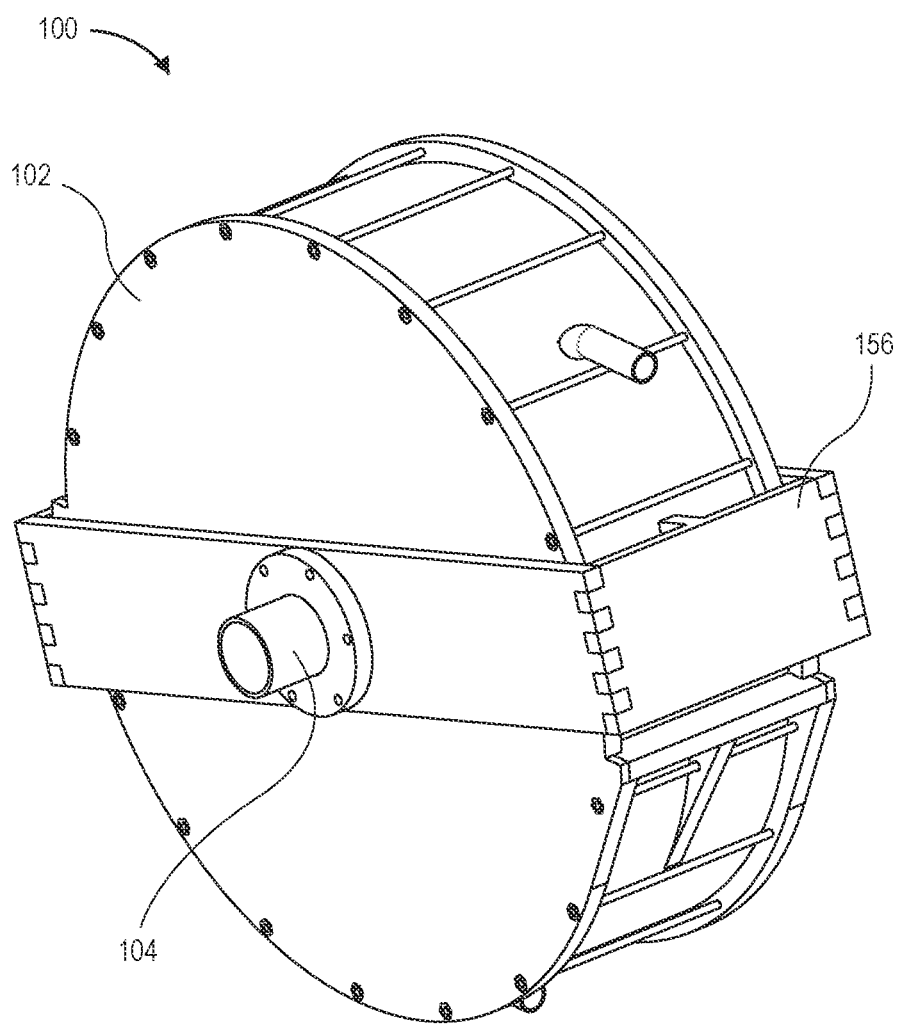
FIG. 2 is a perspective view illustrating the electric machine shown in FIG. 1 in accordance with an example embodiment of the present disclosure.
Figure 3:
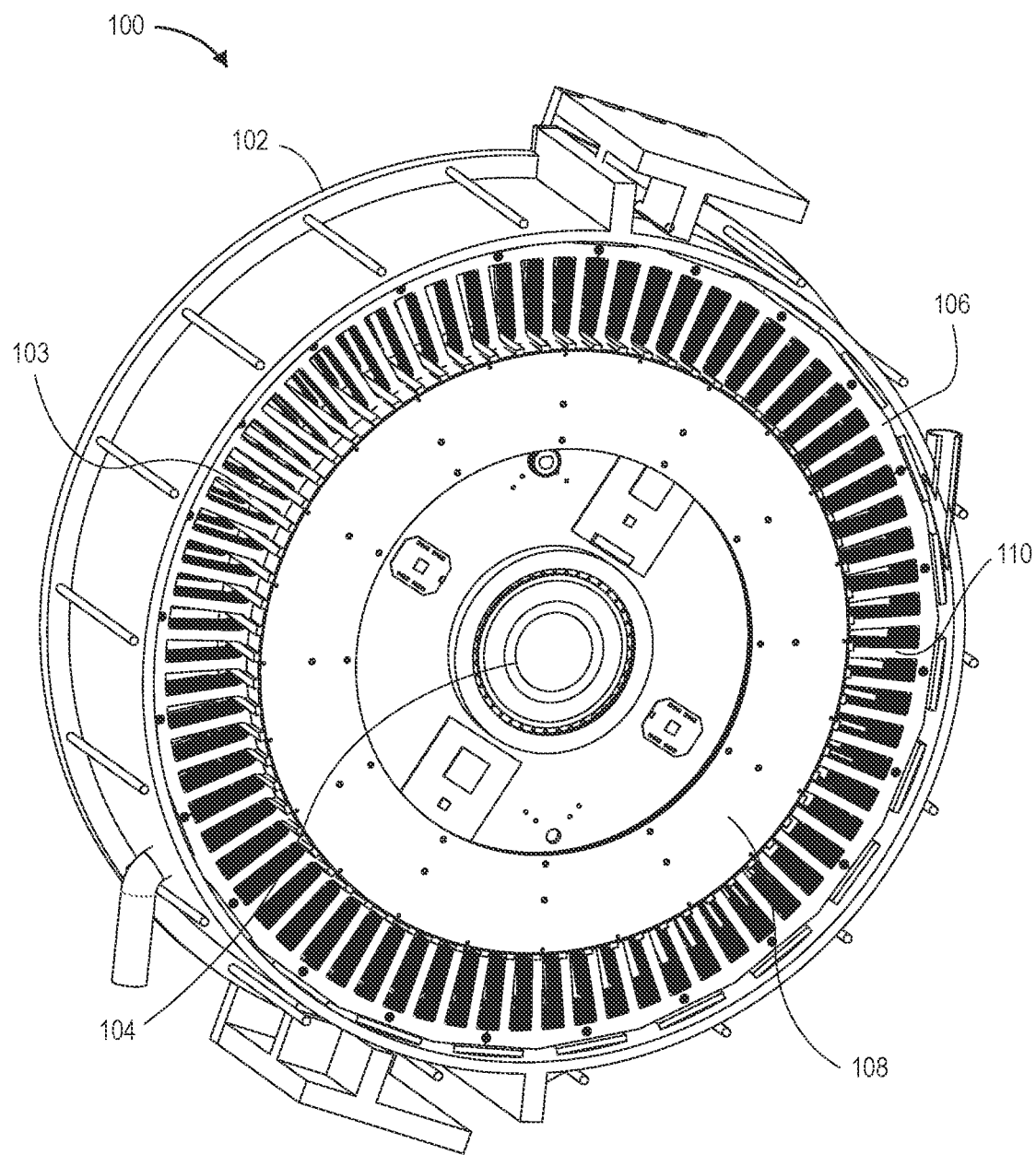
FIG. 3 is a cross-sectional perspective view of the electric machine shown in FIG. 1 showing a stator and a rotor in accordance with an example embodiment of the present disclosure.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

Motors and generators are designed for operation at a specific speed and torque with a very narrow range of optimum efficiency high torque requirements in a motor or generator demand more powerful permanent magnets which in turn create a large back Electromotive Force (EMF) that is in turn overcome with high voltage and current. When rotatable speed and torque are constant, the motor or generator can be designed for optimum efficiency. Often, this efficiency can be well above ninety percent (90%). Thus, in the design and manufacture of such motors and generators, the stator core, core windings and permanent magnets are all selected to act together, to produce the required torque, rotatable speed (RPM), voltage, and current ratios at an optimum or threshold efficiency. Once these key components current electric machine technology are selected and placed in the motor or generator, they cannot be changed. Only the power and speed of the driving force in a generator or the voltage and amperage of the electric current into the motor can be changed. However, when such motors or generators are put in service where the speed and torque vary widely such as in land vehicles and/or wind or water powered generators, the back EMF of the fixed magnets must still be overcome when the speed and torque requirements are less than the maximum designed for and the stator wiring sufficient and appropriately sized when the speed and torque are greater than the maximum designed for. When they are not, the overall efficiency of the motor or generator dramatically drops in many cases to as low as twenty percent (20%) for electric or hybrid vehicles, wind or water powered generators, and the like.

The present disclosure is directed to a cooling system for electric motors, electric generators and/or transmission systems, in particular variable torque generation (VTG) motors, generators, and/or transmission systems that are capable of operating with high efficiency under wide voltage and amperage operating ranges and/or extremely variable torque and rotatable speed (RPM) conditions. Electric motors in accordance with the present disclosure, are well suited for use in technologies were motors produce variable torque and/or rotatable speed (RPM). Similarly, electric generators in accordance with the present disclosure are well suited for use in technologies were variable torque and rotatable speed (RPM) conditions are common such as where variable environmental conditions such as inconsistent wind speed, untimely ocean wave movement, variable braking energy in a hybrid vehicle, and so forth, are frequently encountered. Example technologies may include, for example, technologies employing renewable energy resources including wind power, hydroelectric power, electric or hybrid vehicles, and so forth.

The techniques described herein can dynamically change the output "size" of an electric machine such as a motor, a generator, or a transmission, by one or more of varying the magnetic field induced in the stator by switching multiple non-twisted parallel coil wires in the stator between being connected in all series, all parallel, or combinations thereof and correspondingly turning, varying, adjusting or focusing the magnetic field of the permanent magnets acting on the stator using a tunable Halbach magnet arrangement in the rotor. The tunable Halbach magnet arrangement is comprised of interspersed fixed and rotatable magnets that may be rotated to tune the magnetic field strength of the magnet array. Additionally, as torque/RPM or amperage/voltage requirements change, the system can activate one stator or another (in multiple electric machine units connected to a common computer processor) within the rotor/stator sets and change from parallel to series winding or the reverse through sets of two (2), four (4), six (6), or more parallel, three phase, non-twisted coil windings. In this manner, the system can meet the torque/RPM or amperage/voltage requirements to improve (e.g., optimize or nearly optimize) efficiency.

The cooling system of the present disclosure allows the resistance of stator coils to be incrementally reduced using the series and parallel switching to increase the amperage in the coils without incurring significant losses. In high current applications where coil resistance is reduced, wires may tend to overheat, burn off their insulation, and short out. Cooling the wires would allow the wires to carry more amperage by as much as five times their rated capacity. In comparison to a conventional motor or generator with a single conductor per phase, a cooled conventional electric machine may have its power increased through cooling by as much as five times, where the electric machine of the present disclosure may have its power increased by as much as 30 times. If the temperature of the electric machine is controlled, the temperature can be used as a variable for controlling the series/parallel wire switching system.

The cooling system of the present disclosure includes a sealed stator core having a plurality of stator plates with coil windings, a fluid-tight cavity with a circulating coolant, tubing for circulating water or a different cooling fluid to reduce the temperature of the coolant circulated within the fluid cavity, and thermoelectric devices, such as Peltier devices, positioned around the circumference of the stator core and in contact with the coolant.

In the cooling system of the present disclosure, the thermoelectric devices may be used to convert waste heat from the stator core to electric current, which may be used to power or supplement electric applications within the electric machine. Thermoelectric devices are solid-state heat pumps. Based on the direction of the electrical current passing through them, they transfer heat from one side to another. Alternatively, when there is a temperature difference between the two sides of thermoelectric devices, a voltage difference will build up between the two sides of the thermoelectric devices.

Detailed Description of Example Embodiments

Referring generally to FIGS. 1 through 6, an electric machine 100 is described in accordance with different embodiments of this disclosure. As used herein, the term electric machine may refer to an electric motor, an electric generator, a transmission system, etc. FIGS. 2 through 5 show electric machine 100, having a housing 102, a main axle 104, a stator assembly 106, and a rotor assembly 108. The housing 102 comprises a stator chamber 103. The main axle 104 extends through the housing 102, and is rotatably connected to the electric machine housing, for example, by being supported by at least one bearing. Stator assembly includes a stator core 110 supporting a plurality of coil windings 112. Stator core 110 is comprised by a plurality of stator plates 174 and end plates 172. Stator plates 174 are stacked to each other in the axial direction, with end plates 172 at each end of the plurality of stator plates 174. End plates 172 and stator plates 174 include a plurality of stator teeth 176 that create stator slots 204 located at the inner edge of the stator core, adjacent to the rotor. Wire is wound in the slots 204 around the plurality of stator teeth 176 to form the plurality of stator coil windings 112. Stator plates 174 are shown in detail in FIGS. 7 through 10.

According to an embodiment of the present disclosure, a liquid tight cavity provided. In the embodiments showing the liquid tight cavity, a sealed stator chamber 103 is formed by sealing the space between the ends of the stator teeth 176, the outer circumference of the stator core 110, and both ends of the stator assembly 106. The sealed stator chamber 103 extends beyond the end plates 172 of the stator core. The ends of the stator assembly 106 are sealed with a plate perpendicular to the axle. The stator chamber is non-magnetic, and its thickness does not affect the magnetic field between the ends of the stator teeth 176 and coil windings 112 and the rotor 108.

A coolant is circulated throughout the sealed stator chamber 103 to remove heat from the stator core 110 through convection. The coolant is circulated through said sealed stator chamber 103 passing through the plurality of coil windings 112. The coolant may comprise a mineral oil, liquid nitrogen, or other cooling substance, liquid or gas. In some embodiments, the coolant may comprise a first coolant and a second coolant from the coolants mentioned above or a combination of any of these coolants. The first coolant may be replaced by the second coolant as the temperature of the stator assembly 106 increases above a temperature range.

In one embodiment, the liquid-tight cavity of the sealed stator chamber 103 may include the stator core having a gap between the outer surface of the stator core 110 and the inner surface of the housing 102. In this embodiment, the coolant can circulate across the top part of the stator core 110 as well as through the stator coil 112, and over the stator coil ends. In another embodiment, the electric machine housing 102 is a continuation of the outer surface of the stator core 110. In this embodiment (not shown) coolant flows through the stator coils 112 and over the stator coil ends.

Figure 4:
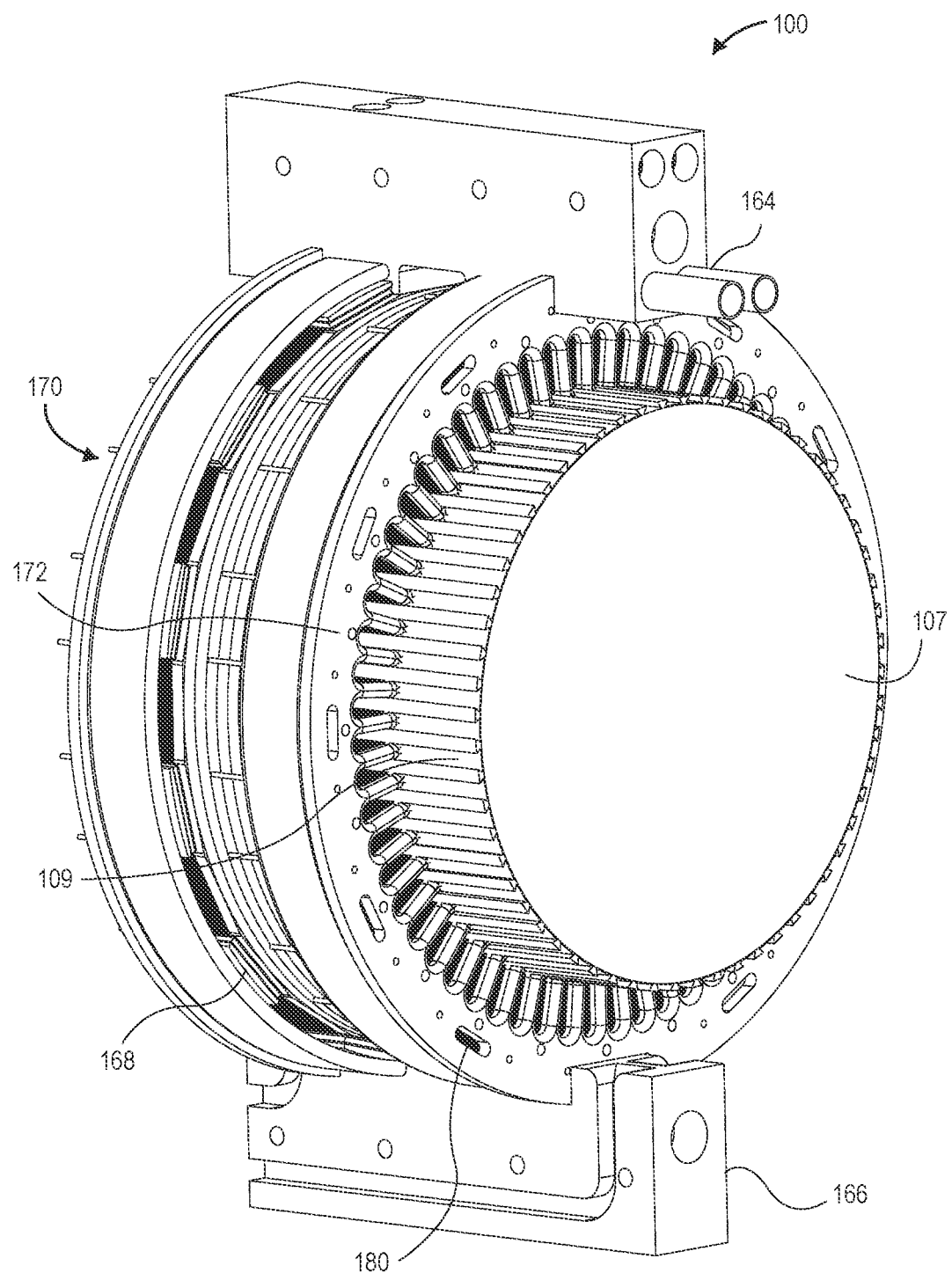
FIG. 4 is a cross-sectional perspective view illustrating a different embodiment of an electric machine, wherein the housing is shown removed, illustrating an electric machine cooling system in accordance with an example embodiment of the present disclosure.

FIG. 4 shows a stator assembly 106 without the housing 102. The liquid tight cavity of the sealed stator chamber 103 may be formed using a tube 107 having longitudinal grooves 109 cut across the outer surface of the tube 107. The longitudinal grooves 109 engage with the stator teeth 176 to create a liquid-tight seal when the tube is inserted through the axial center of the stator 106. The seal tube 107 may be bonded in place with the stator core 110 using a heat-resistant adhesive, such as flexible liquid epoxy glue. It should be understood that other heat-resistant adhesives can be used to secure the seal tube in place. The seal tube 107 is made from a non-magnetic material, including but not limited to heat-resistant polymers, non-magnetic metals or metallic alloys, or a combination thereof.

In one embodiment, a part or the entirety of housing 102 may consist of a finned-diameter heat transfer tube. In this embodiment, heat from the coolant and the stator core 110 is transferred to the heat transfer tube housing through natural or forced air circulation through the fins.

As shown in FIG. 4, the outer diameter of the stator end plate 172 is larger than the outside diameter of the main stator plates 174. A gap 188 is provided between the outer circumference of the stator 190 and the inner surface of the stator housing 102. Gap 188 is provided for allowing coolant to circulate over the outer surface of the stator end plate 172. In a different embodiment, the outer diameter of the stator end plates 172 is the same as the outer diameter of the main stator plates 174.

In a different embodiment of the cooling system for the electric machine 100, sealed tubes may be installed on gap 188, around the circumference of the stator core between the stator core and the housing 102. These tubes may circulate water or another fluid to cool down the coolant flowing through the stator core 110 and stator coils 112. This embodiment may be especially beneficial in marine applications where there is access to flowing water or where a separate water-cooling radiator is available.

As illustrated in FIG. 4, the sealed chamber 103 includes a coolant inlet port 166 and a coolant outlet port 164, wherein said inlet and outlet ports are fluidically coupled to a heat exchanger (not shown) for removing heat from the coolant. A transfer pump (not shown) circulates the coolant within the sealed chamber 103. After entering from the coolant inlet port 166, the coolant enters the chamber gap 188 between the housing 102 and the stator core 110. The coolant enters the space between sets of stators separated by spacers 177 and flows axially through the stator teeth 176 and outside the stator core through end plates 172, back to the gap 188. Finally, the coolant flows outside the housing 102 through outlet port 164.

Housing 102 may comprise of different subsections through which coolant flows in the cooling system disclosed herein. In one embodiment, the coolant flows through an internally finned tube with externally finned heat transfer plates on either side of the internally finned tube. Following, the coolant may flow through another internally-finned tube having a plurality of thermoelectric devices 168 on either side of the finned heat transfer plates. Finned heat transfer plates (not shown) may be connected on the outside surface of the thermoelectric devices 168.

Figure 11:
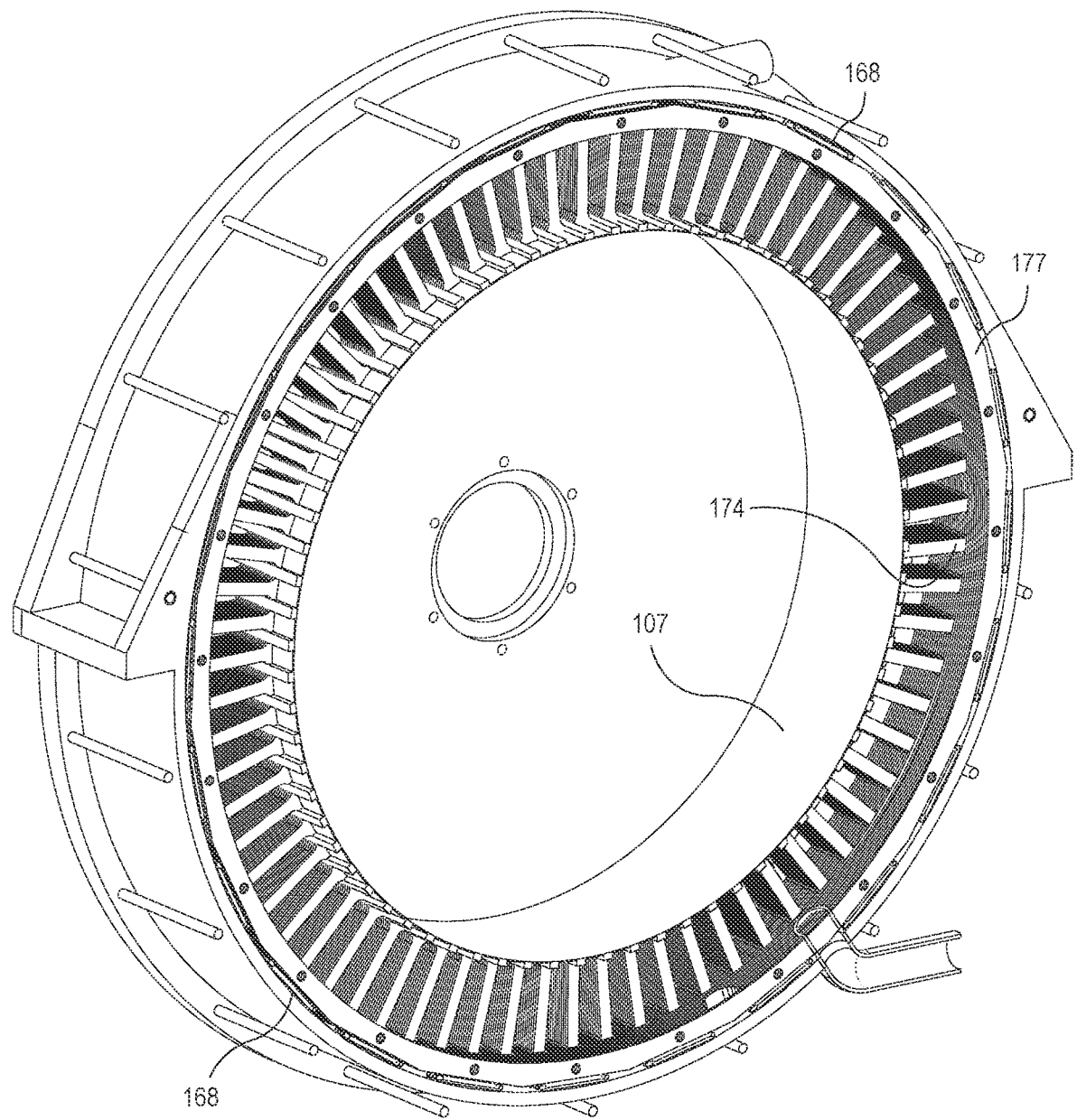
FIG. 11 is a cross-sectional perspective view of the stator shown in FIG. 4 wherein the housing is shown removed, illustrating an electric machine cooling system in accordance with an example embodiment of the present disclosure.
Figure 12:
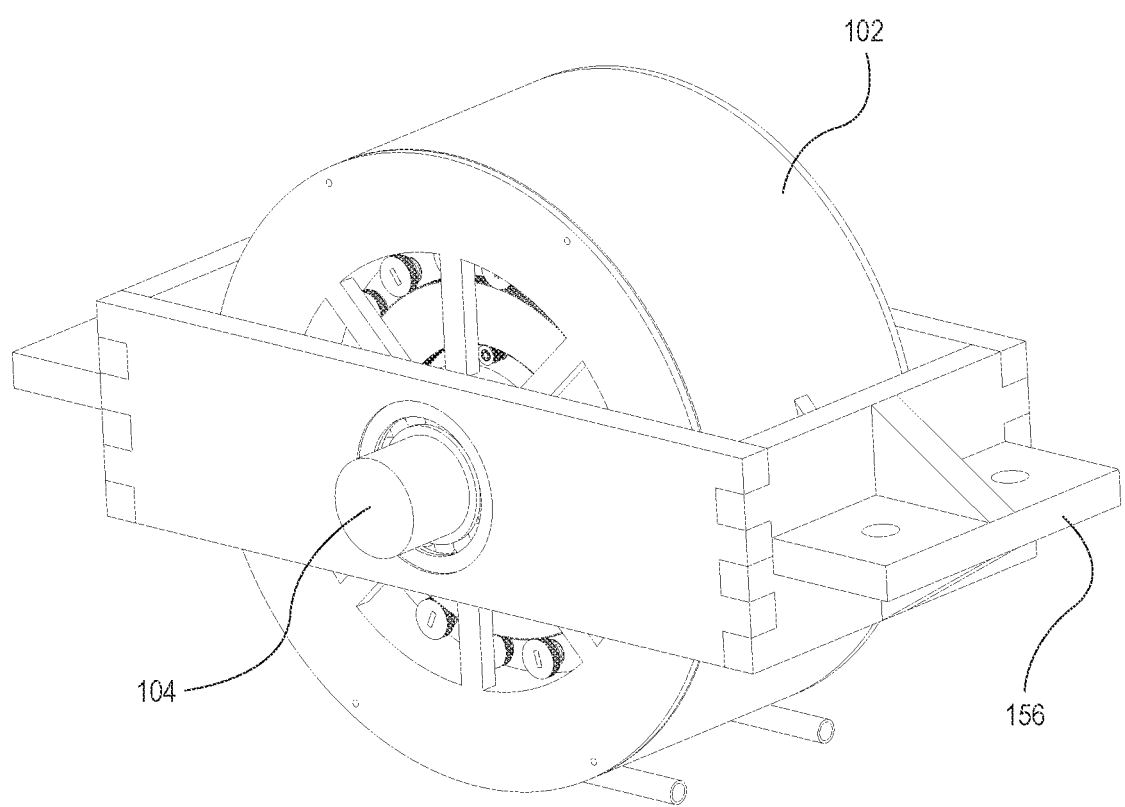
FIG. 12 is an alternative embodiment of an electric machine having an open housing in accordance with an example embodiment of the present disclosure.
Figure 13:
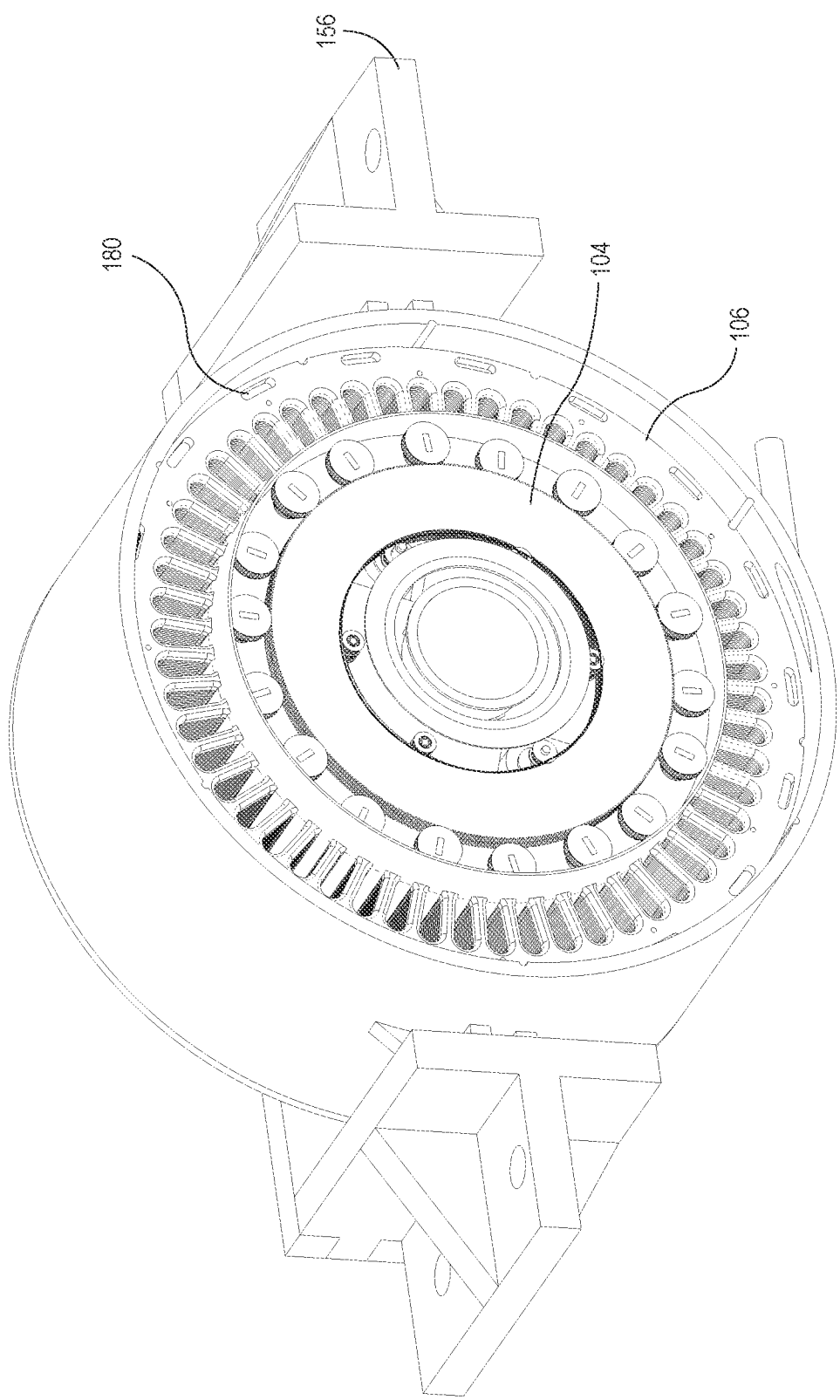
FIG. 13 is a perspective cross-sectional view of the electric machine shown in FIG. 12, showing a stator and a rotor in accordance with an example embodiment of the present disclosure.
Figure 14:
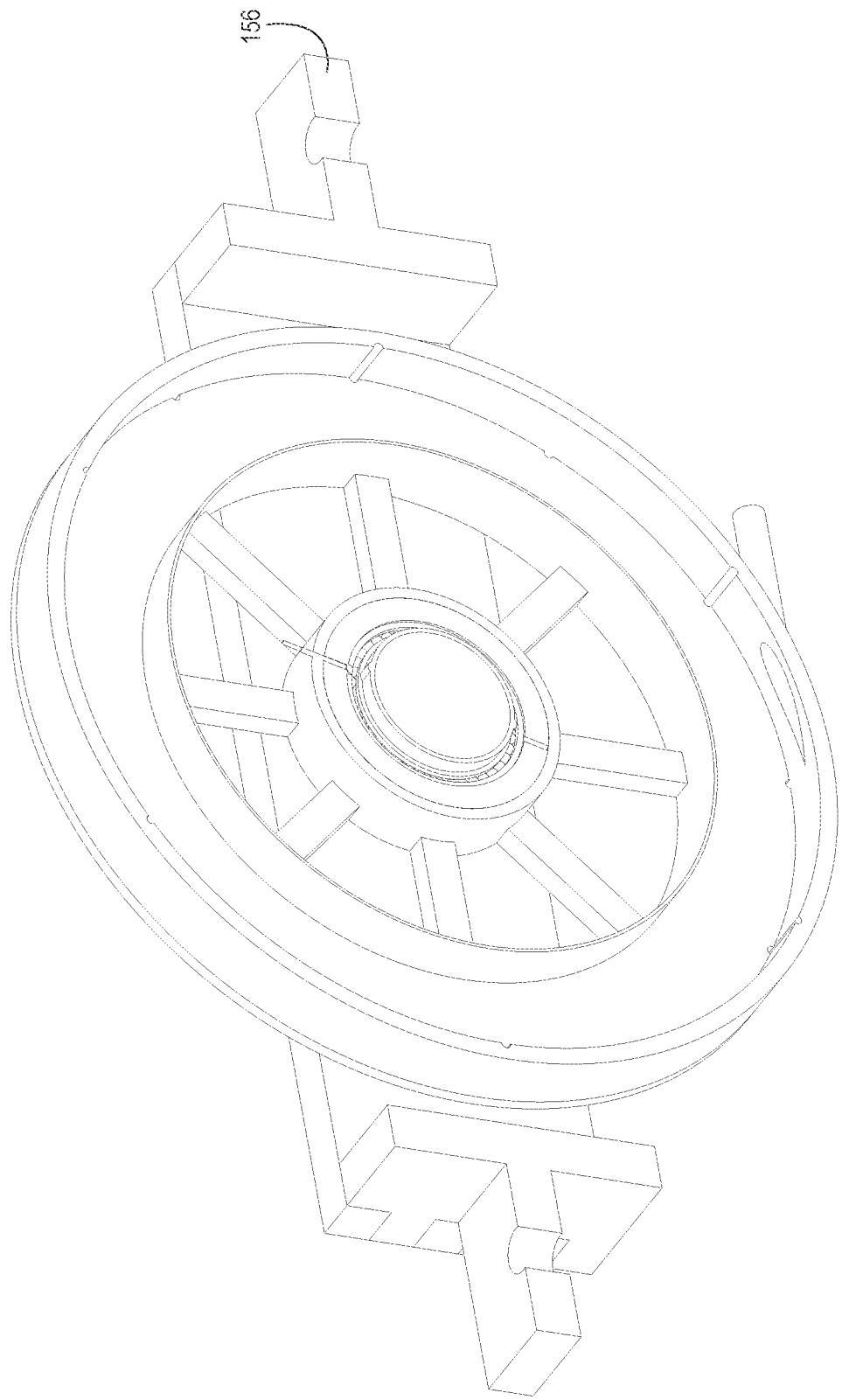
FIG. 14 is a partial perspective view of the housing endcap shown in FIG. 12 showing a stator and a rotor in accordance with an example embodiment of the present disclosure.

FIG. 11 shows the inside of the sealed stator chamber 102 having a plurality of thermoelectric devices 168 arranged within said sealed chamber. As coolant is circulated over the thermoelectric devices, the thermoelectric devices may further remove heat from the coolant and/or generate a flow of electricity through the Peltier effect. The thermoelectric devices may be intermittently energized as dictated by the level of heat to be transferred, as predetermined by a system controller.

Thermoelectric devices 168 may also be placed around the circumference of the stator core, between the stator core 110 and the water-circulating sealed tubes located on gap 188. In this embodiment, a heat differential between the stator core 110 and the water-circulating tubes may be used by the thermoelectric devices 168 to convert waste heat from the stator core 110 into an electric current. This current may have different applications, including but not limited to powering or supplementing circulation pumps, or electronics within the housing 102 such as electronic switches, motor controllers, etc.

In embodiments where the housing 102 consists of a heat transfer tube with a finned outer diameter, the thermoelectric devices 168 may be bonded directly to the inside of the heat transfer tube, to be located between the stator core 110 and the housing 102. In other embodiments where the housing 102 is an extension of the outer surface of the stator core 110, such as the embodiment shown in FIG. 11, the thermoelectric devices 168 may be bonded to the housing 102.

In embodiments where the outer diameter of the end plates 172 is the same as the outer diameter of the main stator plates 174, the thermoelectric devices 168 may be positioned between two or more different sets of stator cores 110 and next to the outer diameter of end plates 172. In these embodiments, the coolant flows only through the space in the stator slots left by the coil windings and around the ends of the coil windings as the windings encircle the plurality of stator teeth. Additionally, holes (not shown) may be drilled in the axial direction through the stator coil, where coolant may also circulate.

Figure 7:
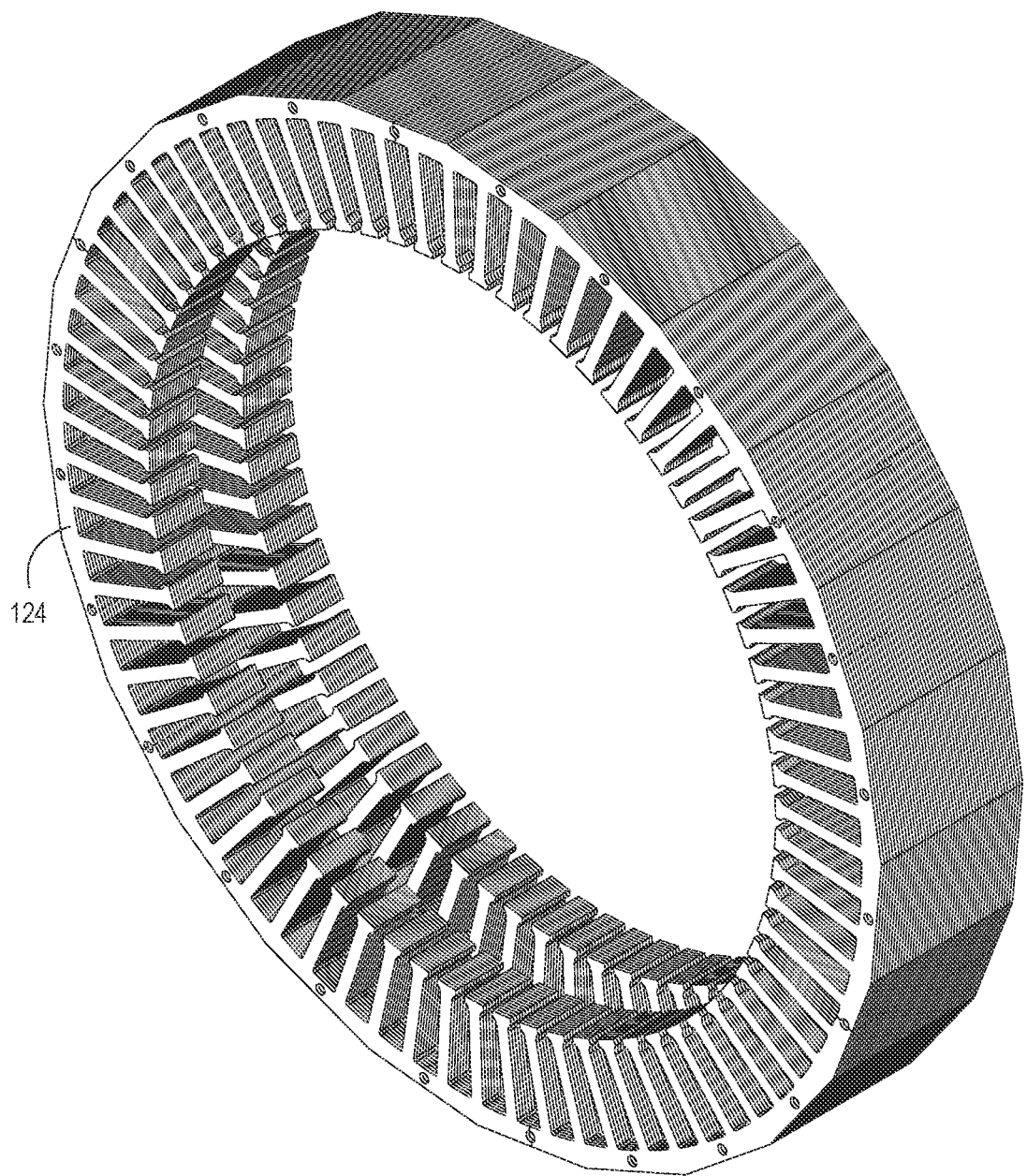
FIG. 7 shows a plurality of stator plates from the stator from the stator shown in FIG. 3 in accordance with an example embodiment of the present disclosure.
Figure 8:
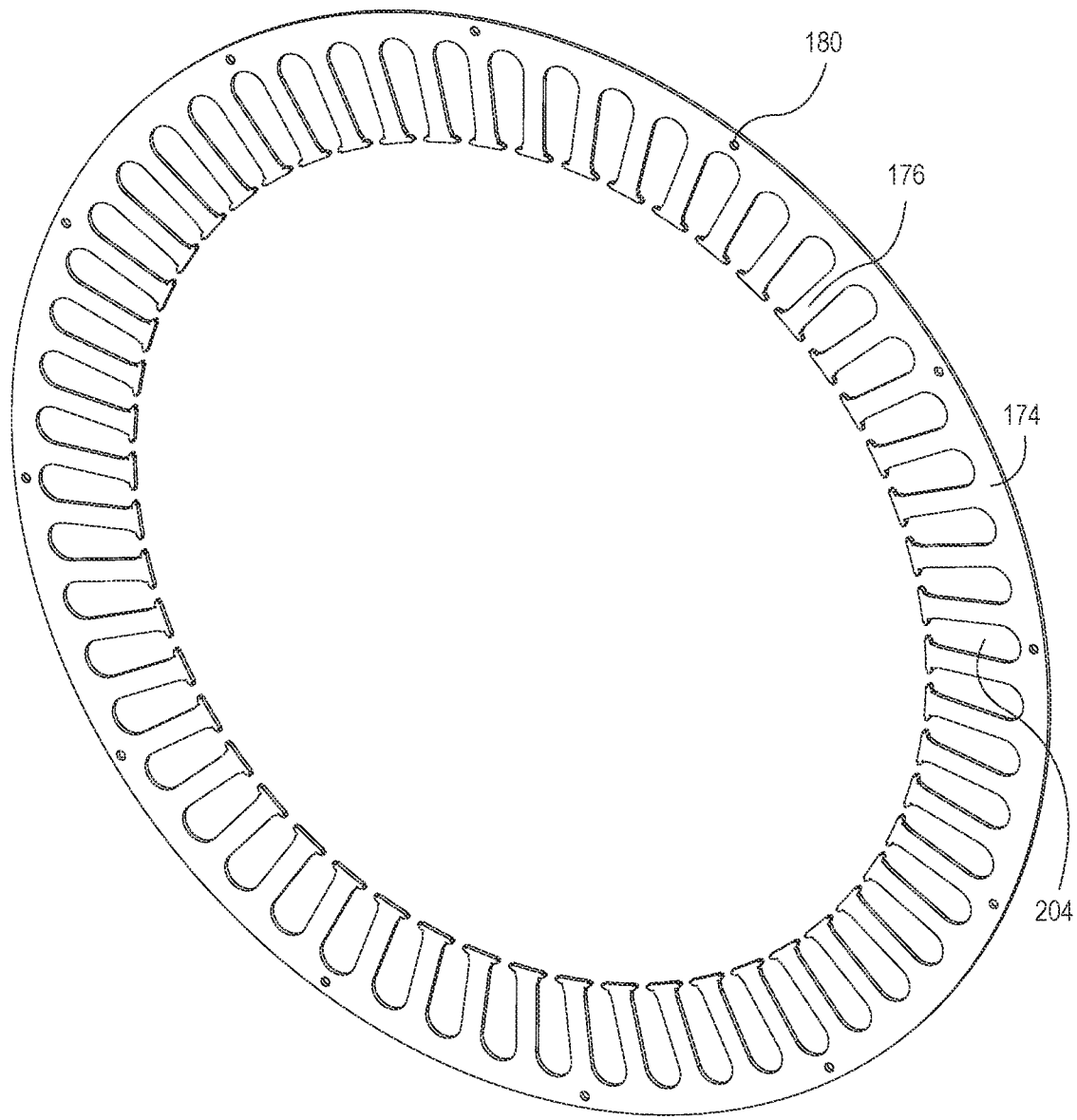
FIG. 8 shows a single stator plate shown in FIG. 7 in accordance with an example embodiment of the present disclosure.
Figure 9:
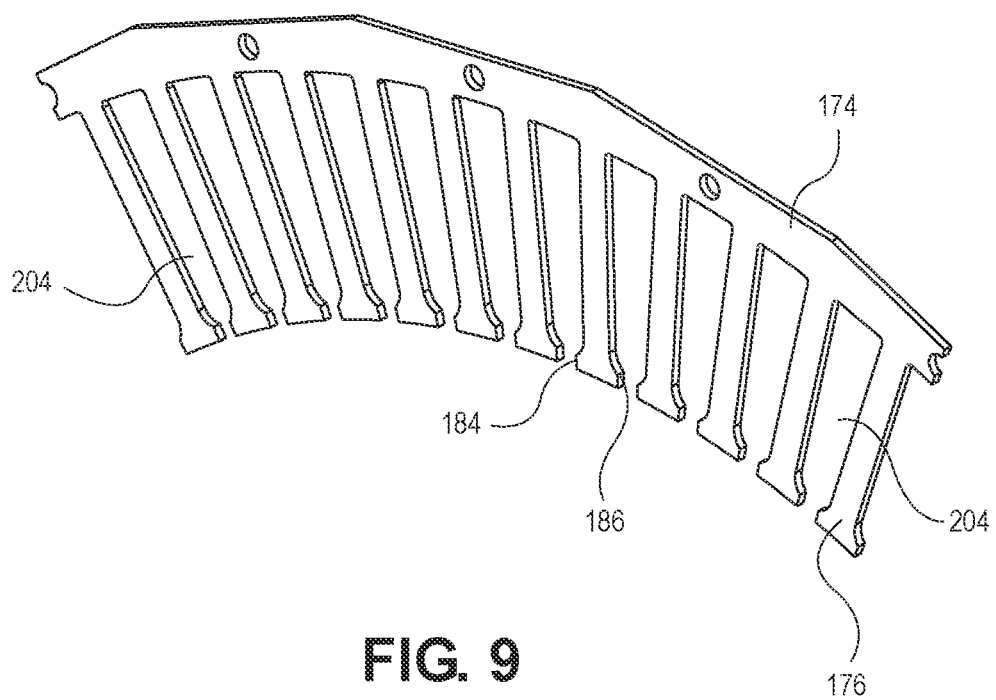
FIG. 9 shows a partial view of the stator plate shown in FIG. 8 showing a detailed view a plurality of stator teeth in accordance with an example embodiment of the present disclosure.
Figure 10:
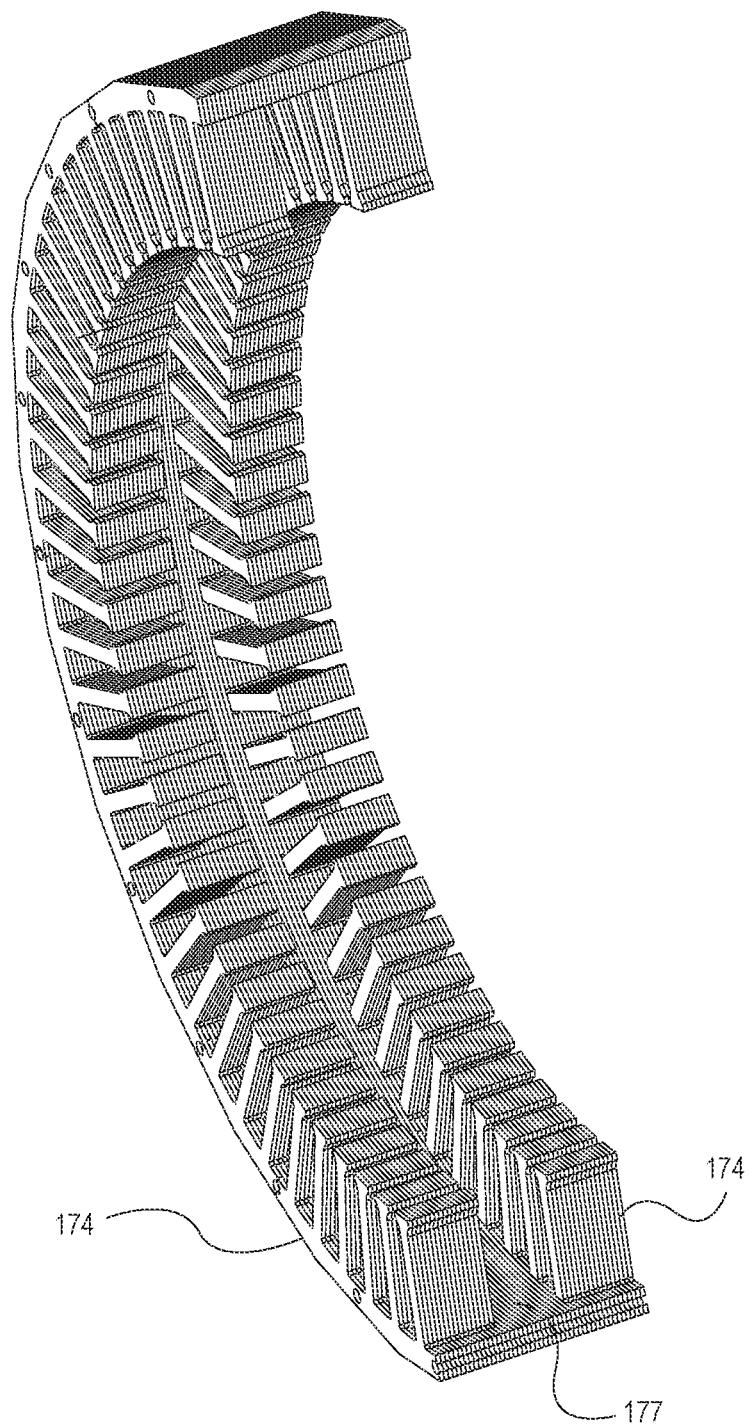
FIG. 10 is a cross-sectional view of the plurality of stator plates shown in FIG. 7 in accordance with an example embodiment of the present disclosure.

FIGS. 7 and 10 show an example of wo sets of stator cores 110 next two each other, each comprising a plurality of main stator plates 174. The two different sets of stator cores are separated by a plurality of spacers 177 stacked together in the axial direction.

In different embodiments of the cooling system, the thermoelectric devices 168 may be energized separately with an electric current to act as thermoelectric coolers (TEC). In these embodiments, the thermoelectric devices 168 may accelerate the transfer of heat from the coolant and/or the stator core 110 to the water tubes, the finned outer tube, or a combination of both. The thermoelectric devices could be used as thermoelectric coolers particularly in high-heat applications, or situations when a temperature exceeds a predetermined temperature range.

Figure 5:
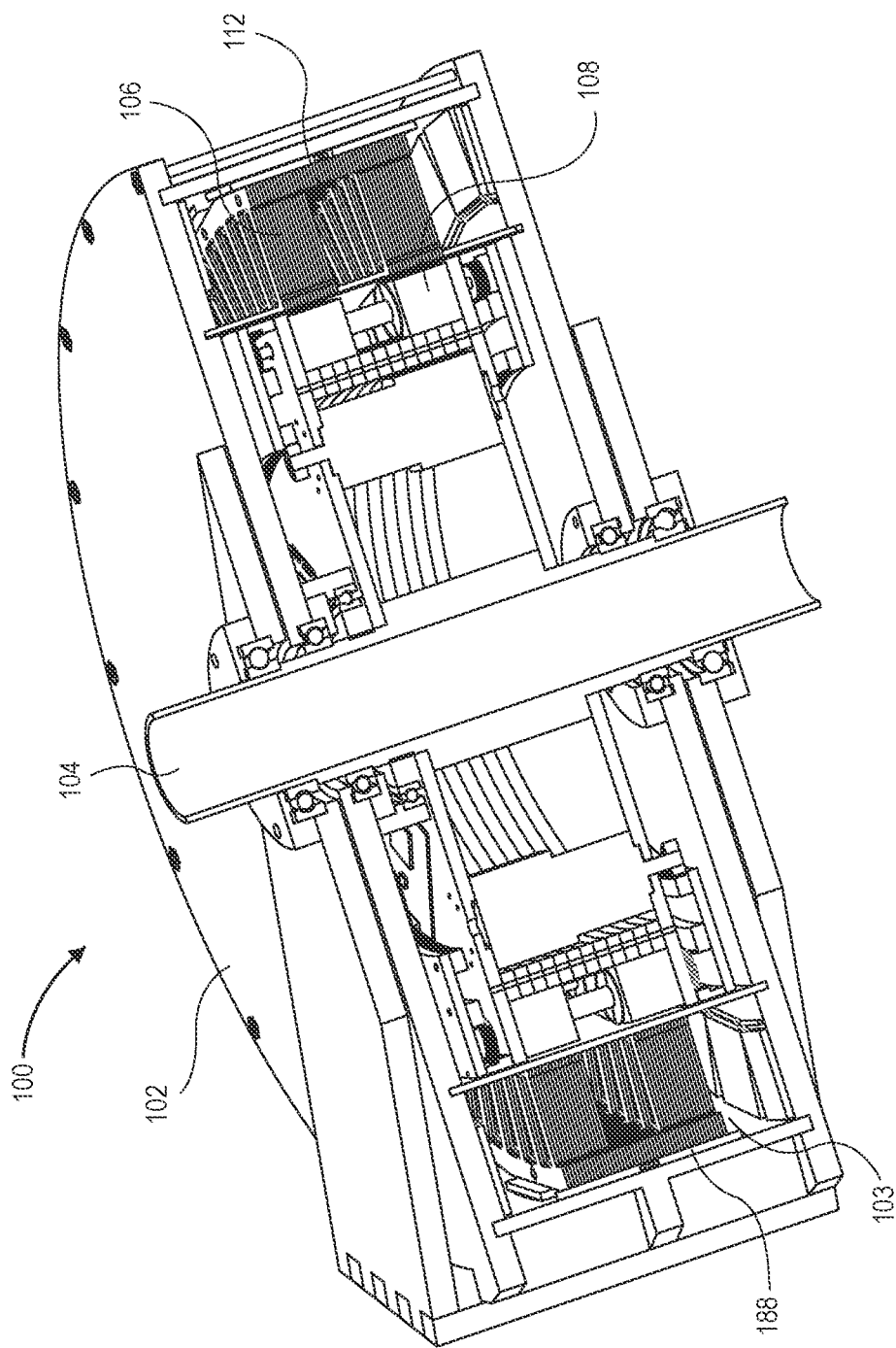
FIG. 5 is a cross-sectional perspective view of the electric machine shown in FIG. 1 further showing the stator and the rotor in accordance with an example embodiment of the present disclosure.
Figure 6:
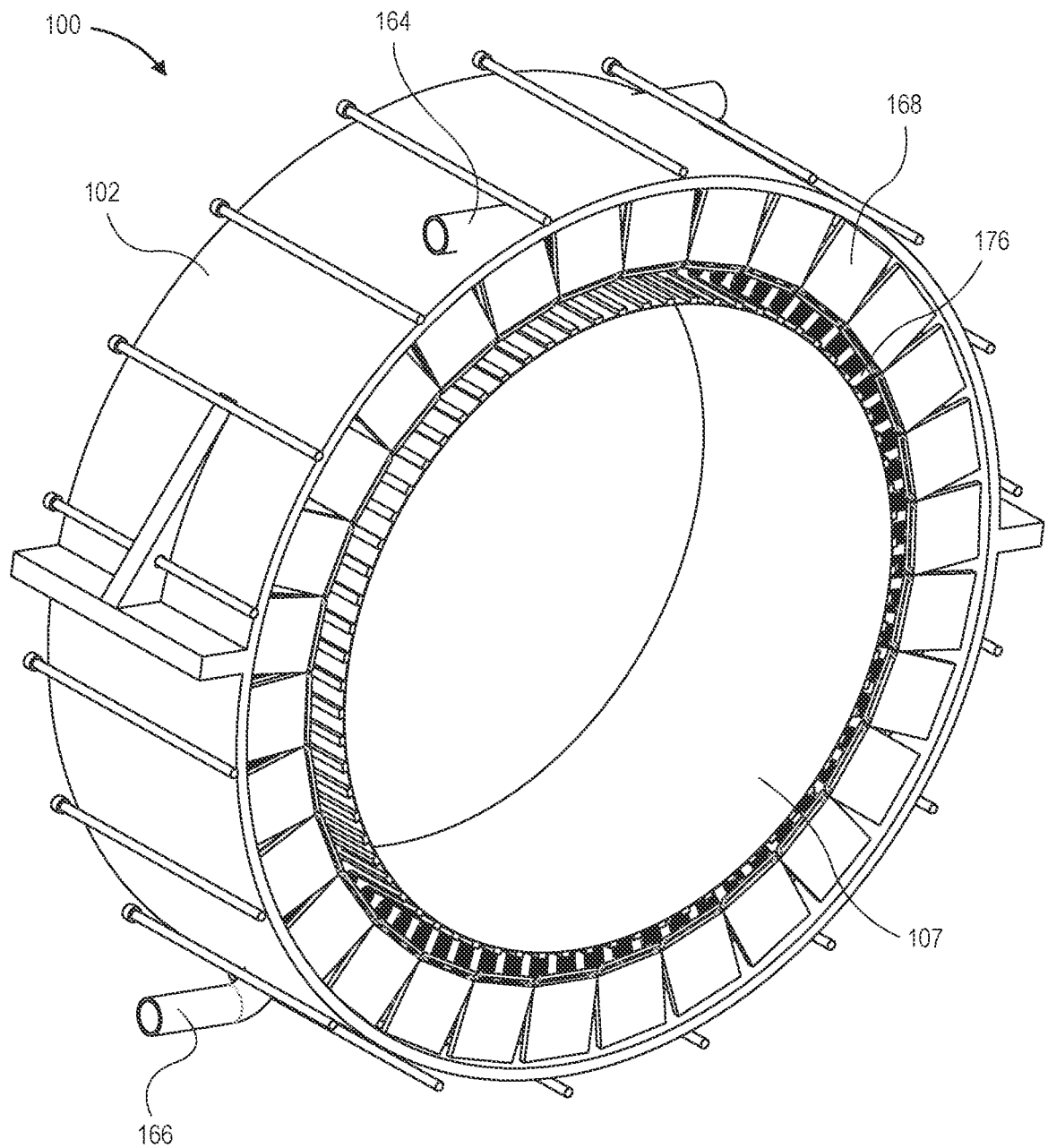
FIG. 6 shows the electric machine shown in FIG. 1 with a different embodiment of the electric machine cooling system in accordance with an example embodiment of the present disclosure.
Figure 15:
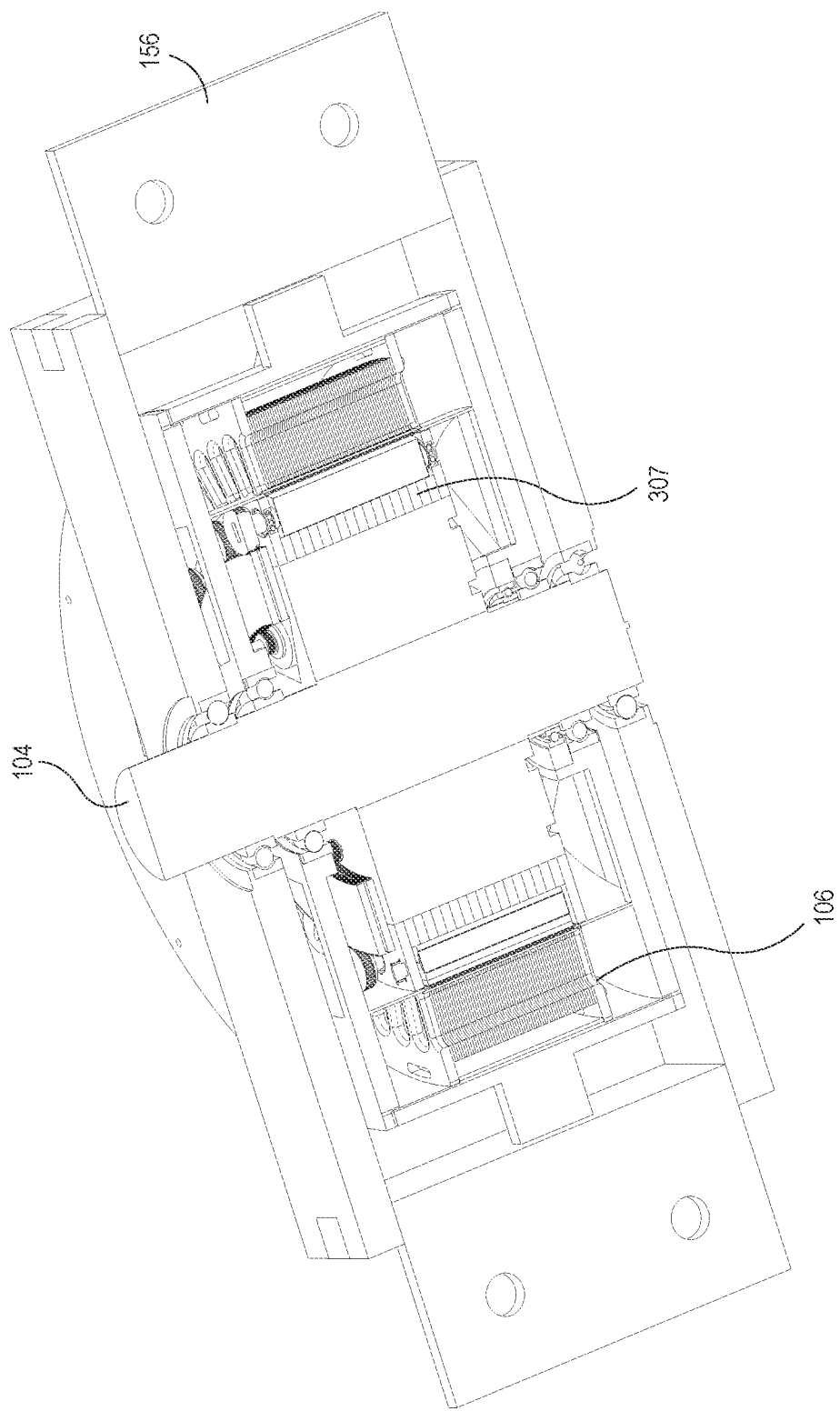
FIG. 15 is a cross-sectional perspective view of the electric machine shown in FIG. 12 showing a stator and a rotor in accordance with an example embodiment of the present disclosure.
Figure 16:
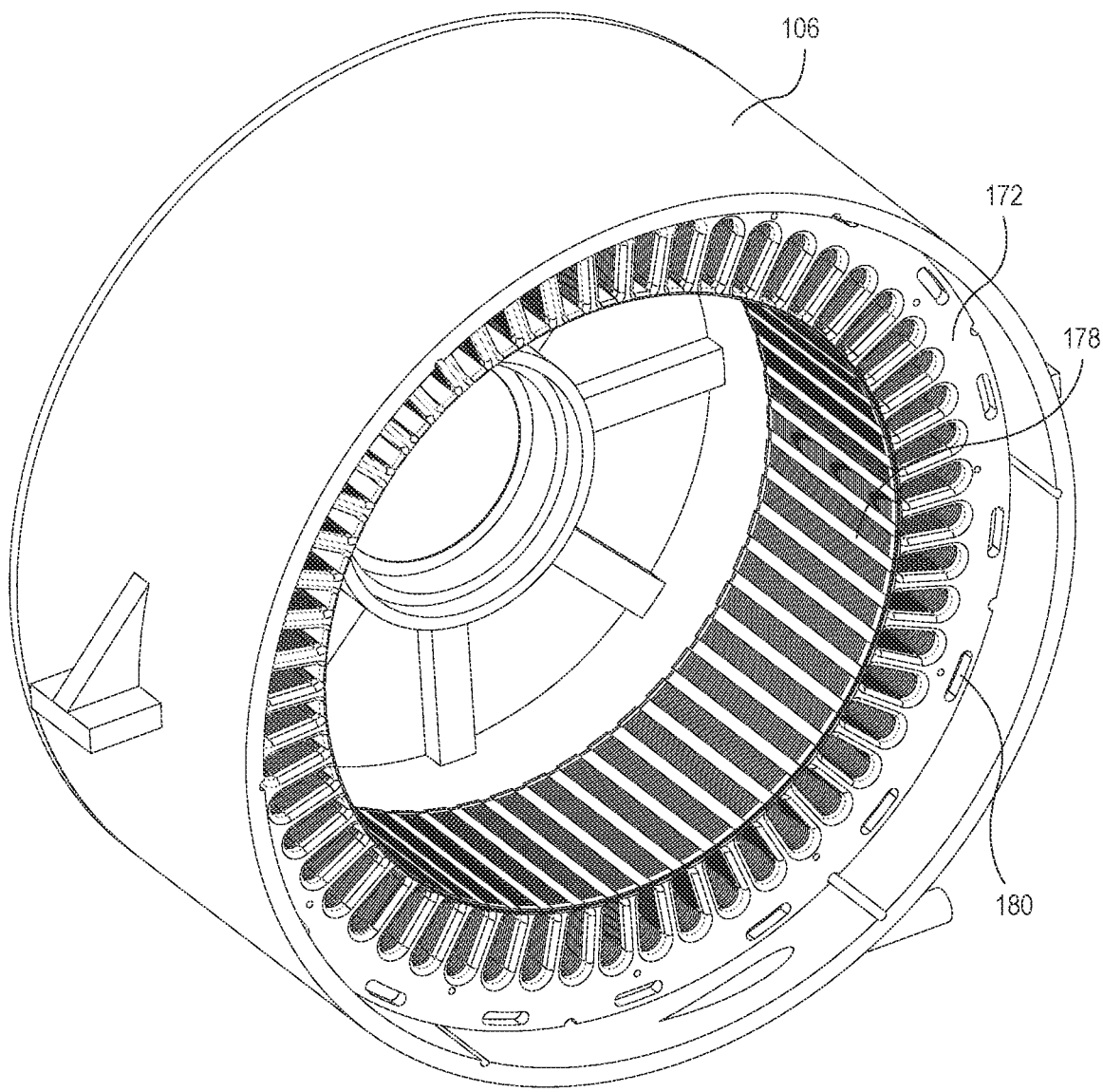
FIG. 16 is a perspective view of the electric machine shown in FIG. 12 showing a cooling system where the stator teeth are sealed by sealing strips in accordance with an example embodiment of the present disclosure.
Figure 17:
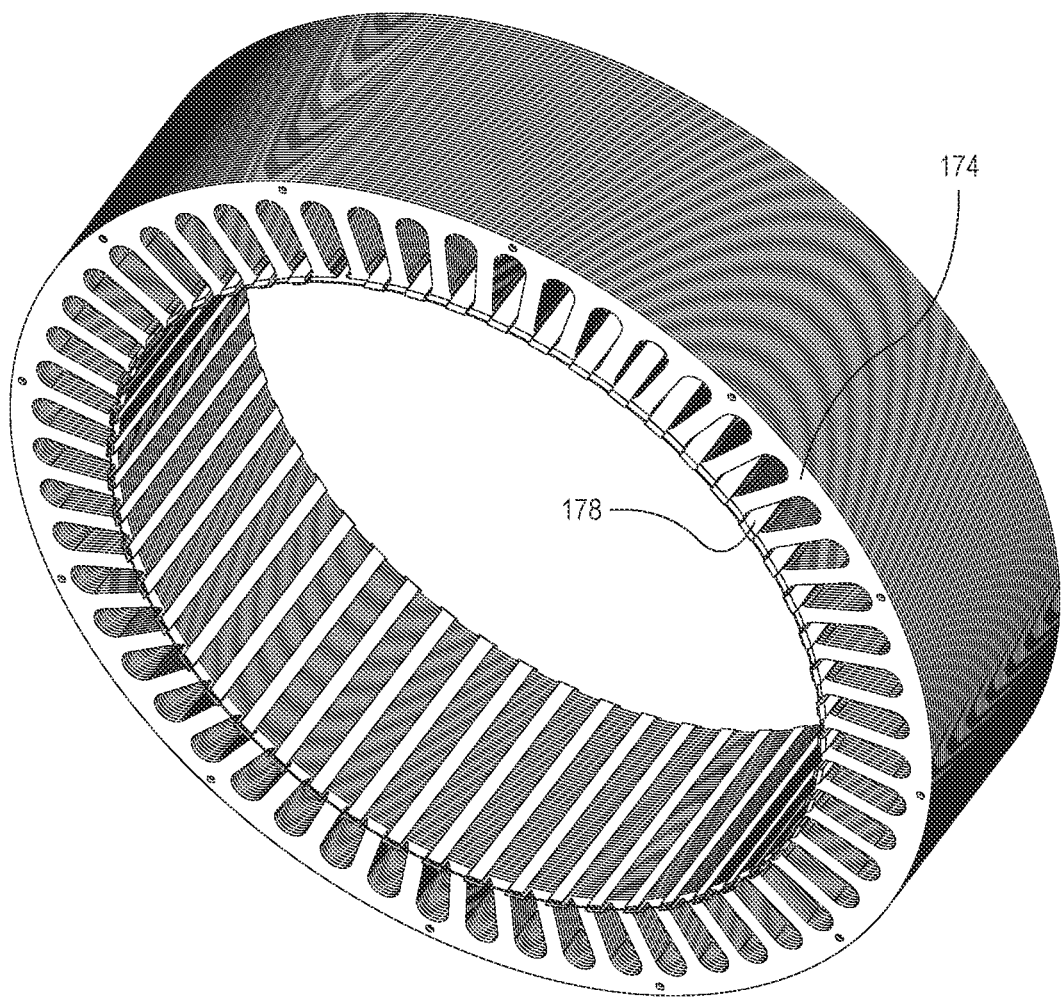
FIG. 17 is a perspective view of a plurality of stator plates as shown in FIG. 16 in accordance with an example embodiment of the present disclosure.
Figure 18:
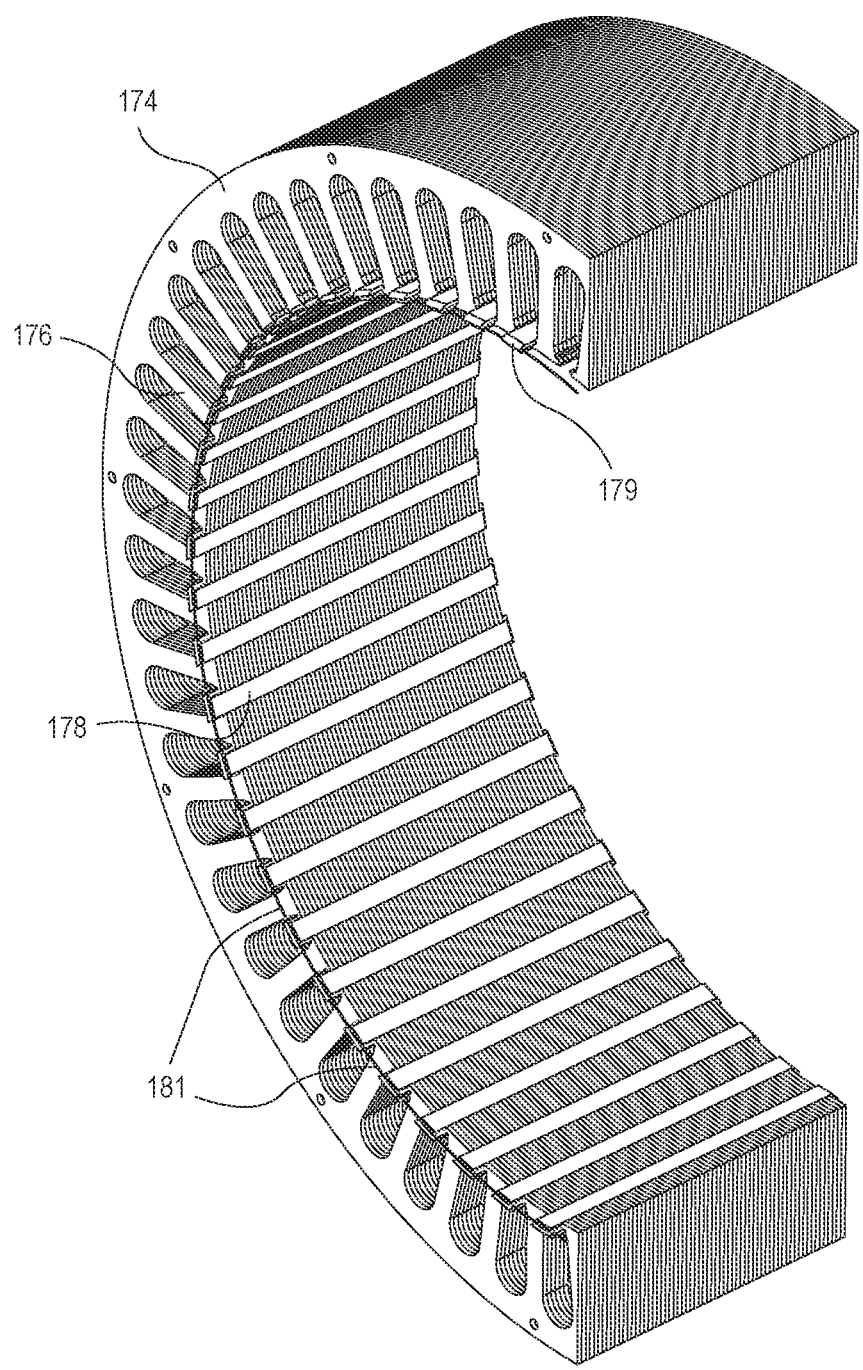
FIG. 18 is a partial view of the plurality of stator plates shown in FIG. 16 in accordance with an example embodiment of the present disclosure.

FIGS. 12 through 18 show another embodiment of the cooling system of the electric machine 100. The cooling system includes a stator end plate 172, main stator plates 174 having main stator teeth 176, and stator cool plugs 178. The stator end plate 172 includes slotted holes 180 around the periphery of the outer diameter 182. FIG. 16 illustrates the stator assembly 106 with main stator plates 174, end plates 172 and stator cool plugs 178. FIG. 10 shows the main stator teeth 176 in more detail. The stator cool plugs 178 can be installed with a heat-resistant adhesive to adhere the stator cool plugs to the contact surfaces on the stator plates 184 and 186. The stator cool plugs 178 extend through the length of the housing 102, extending further from the stator end plates to keep the stator cavity sealed, as shown in FIGS. 5 and 15. The cool plugs 178 comprise slotted ends 179 wherein a rubber gasket 181 may be fitted to assist the seal between the stator core 110 and the stator end plates 172, as shown in FIGS. 17 and 18.

In some embodiments of the electric machine 100, coolant may be circulated through system electronics located within a sealed tub (not shown) in the housing 102. The coolant may flow from a first pipe located in an inlet manifold into the sealed tub and return through a second pipe located in an outlet manifold. The first and second pipes may be flexible to allow for movement and rotation of stator may be 106. The system electronics may include electronic switches and motor controllers.

In certain embodiments, the cooling system of electric machine 100 does not include a sealed stator chamber 103 for circulating a coolant. In these embodiments, the thermoelectric devices 168 may be disposed on the inner surface of the housing 102, between the housing 102 and the stator core 110 to collect waste energy from the stator core 110 or to accelerate the transfer of heat between the stator core 110 and the housing 102.

The stator end plate 172 can be aluminum, stainless steel, or any other metallic material known in the art. The stator end plate 172 and the main stator plates 174 can be made from different materials or can be made from the same material. The materials for the main stator plates 174 include but are not limited to magnetic iron, amorphous iron foil, a combination thereof. The stator cool plugs 178 may be made from plastic, silicone, epoxy carbon material or other polymerous materials. A gap 196 between stator cool plug 178 and the stator teeth 176 may be included in different embodiments of the present invention, while still maintaining the fluid-tight seal of the stator chamber 103.

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:

1. An electric machine, comprising:
    a housing comprising a wall that defines a sealed stator chamber, the wall extending from a first end to a second end;
    a stator assembly disposed within the sealed stator chamber, the stator assembly comprising a stator core and a plurality of wire windings supported by the stator core, the stator assembly including a first stator end plate, a second stator end plate, and a periphery surface that extends from the first stator end plate to the second stator end plate;
    a first plurality of thermoelectric devices arranged between the periphery surface of the stator assembly and the wall of the sealed stator chamber;
    a second plurality of thermoelectric devices arranged between the first stator end plate of the stator assembly and the first end of the sealed stator chamber;
    a third plurality of thermoelectric devices arranged between the second stator end plate of the stator assembly and the second end of the sealed stator chamber; and
    a controller electrically coupled and configured to supply a current to each of the thermoelectric devices,
    wherein the sealed stator chamber is configured to receive a coolant that is circulated through the sealed stator chamber over the stator core and plurality of wire windings to remove heat from the stator core and the plurality of wire windings, and
    wherein the coolant is circulated over the first, second, and third pluralities of thermoelectric devices, each of the thermoelectric devices operating as thermoelectric coolers (TEC) utilizing the Peltier effect when each of the thermoelectric devices receives the current to thereby accelerate heat transfer from the coolant, wherein each thermoelectric device generates a temperature differential as thermoelectric coolers (TEC) in utilizing the Peltier effect based on the current.

2. The electric machine as recited in claim 1, wherein the stator core comprises:
a plurality of stator plates located between the first stator end plate and the second stator end plate,
wherein each of the stator plates, the first stator end plate, and the second stator end plate have a plurality of stator teeth.

3. The electric machine as recited in claim 2, further comprising a non-magnetic tube with longitudinal grooves cut through an outer surface, the longitudinal grooves engaging with the plurality of stator teeth in the stator core creating a fluid-tight cavity.

4. The electric machine as recited in claim 1, wherein the sealed stator chamber includes an inlet port and an outlet port fluidically coupled to a heat exchanger assembly for removing heat from the coolant.

5. The electric machine as recited in claim 4, wherein the coolant comprises a mineral oil.

6. The electric machine as recited in claim 4, wherein the coolant comprises a first coolant that is replaced by a second coolant as the temperature of the stator assembly increases.

7. The electric machine recited in claim 1, wherein the electric machine further includes fluid-circulating tubes disposed around the wall of the housing.

8. The electric machine recited in claim 7, wherein the fluid-circulating tubes circulates water.

9. The electric machine recited in claim 7, wherein the first plurality of thermoelectric devices is placed between the stator core and the fluid-circulating tubes.

10. The electric machine recited in claim 1, wherein the coolant is further circulated through electronics, the electronics including a motor controller.

11. The electric machine recited in claim 1, wherein the contoller is configured to supply the current to each of the thermoelectric devices when a temperature of the electric machine exceeds a predetermined temperature range.

12. The electric machine recited in claim 9, wherein the first plurality of thermoelectric devices transfer heat from the coolant to the fluid-circulating tubes.

13. The electric machine recited in claim 1, wherein each of the thermoelectric devices transfer heat from the coolant to the housing.

14. An electric machine, comprising:
a housing comprising a wall that defines a sealed stator chamber, the wall extending from a first end to a second end;
a stator assembly disposed within the sealed stator chamber, the stator assembly comprising a stator core and a plurality of wire windings supported by the stator core, the stator assembly including a first stator end plate and a second stator end plate;
a first plurality of thermoelectric devices arranged between the first stator end plate of the stator assembly and the first end of the sealed stator chamber; and
a second plurality of thermoelectric devices arranged between the second stator end plate and the second end of the sealed stator chamber,
a controller electrically coupled and configured to supply a current to each of the thermoelectric devices,
wherein the sealed stator chamber is configured to receive a coolant circulated through the sealed stator chamber over the stator core and plurality of wire windings to remove heat from the stator core and the plurality of wire windings, and
wherein the coolant is circulated over the first and second pluralities of thermoelectric devices, each of the thermoelectric devices operating as thermoelectric coolers (TEC) utilizing the Peltier effect when each of the thermoelectric devices receives the current to thereby accelerate heat transfer from the coolant.

15. The electric machine as recited in claim 14, wherein the stator core comprises:
a plurality of stator plates located between the first stator end plate and the second stator end plate,
wherein each of the stator plates, the first stator end plate, and the second stator end plate have a plurality of stator teeth.

16. The electric machine as recited in claim 14, wherein the sealed stator chamber includes an inlet port and an outlet port fluidically coupled to a heat exchanger assembly for removing heat from the coolant.

17. The electric machine as recited in claim 14, wherein the coolant comprises a mineral oil.

18. The electric machine recited in claim 14, wherein the electric machine further includes fluid-circulating tubes disposed around the wall of the housing.

19. The electric machine recited in claim 14, wherein the contoller is configured to supply the current to each of the thermoelectric devices when a temperature of the electric machine exceeds a predetermined temperature range.

20. The electric machine recited in claim 14, wherein each of the thermoelectric devices transfer heat from the coolant to the housing.

* * * * *